(12) United States Patent
Khaderbad et al.

(10) Patent No.: US 12,243,915 B2
(45) Date of Patent: Mar. 4, 2025

(54) GRAPHENE WRAP-AROUND CONTACT

(71) Applicant: Taiwan Semiconductor Manufacturing Co., Ltd., Hsinchu (TW)

(72) Inventors: Mrunal Abhijith Khaderbad, Hsinchu (TW); Wei-Yen Woon, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 414 days.

(21) Appl. No.: 17/550,759

(22) Filed: Dec. 14, 2021

(65) Prior Publication Data

US 2022/0285515 A1 Sep. 8, 2022

Related U.S. Application Data

(60) Provisional application No. 63/157,540, filed on Mar. 5, 2021.

(51) Int. Cl.
| | |
|---|---|
| *H01L 29/16* | (2006.01) |
| *H01L 21/768* | (2006.01) |
| *H01L 21/8234* | (2006.01) |
| *H01L 21/8238* | (2006.01) |
| *H01L 29/423* | (2006.01) |
| *H01L 29/66* | (2006.01) |
| *H01L 29/786* | (2006.01) |

(52) U.S. Cl.
CPC .... *H01L 29/1606* (2013.01); *H01L 21/76843* (2013.01); *H01L 21/823418* (2013.01); *H01L 21/823431* (2013.01); *H01L 21/823814* (2013.01); *H01L 21/823821* (2013.01); *H01L 29/42392* (2013.01); *H01L 29/66045* (2013.01); *H01L 29/78618* (2013.01)

(58) Field of Classification Search
CPC ..... H01L 21/823814; H01L 21/823821; H01L 29/66636; H01L 29/1606; H01L 21/823418; H01L 21/823431; H01L 21/76843
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |

(Continued)

*Primary Examiner* — Peter M Albrecht
(74) *Attorney, Agent, or Firm* — Sterne, Kessler, Goldstein & Fox P.L.L.C.

(57) ABSTRACT

The present disclosure provides source/drain epitaxial structures and source/drain contacts wrapped with graphene layers in fin structures of field effect transistors, and fabricating methods thereof. In some embodiments, a disclosed semiconductor device includes a fin structure on a substrate. The fin structure includes an epitaxial region. The semiconductor device further includes a metal contact above the epitaxial region, and a graphene film covering a top surface and sidewalls of the epitaxial region and covering a bottom surface and sidewalls of the metal contact.

20 Claims, 12 Drawing Sheets

(56) References Cited

U.S. PATENT DOCUMENTS

| | | |
|---|---|---|
| 9,831,183 B2 | 11/2017 | Lin et al. |
| 9,859,386 B2 | 1/2018 | Ho et al. |
| 2017/0243791 A1* | 8/2017 | Jacob .............. H01L 21/823814 |
| 2019/0161351 A1* | 5/2019 | Song .................... C01B 32/186 |

* cited by examiner

GRAPHENE WRAP-AROUND CONTACT

CROSS-REFERENCE TO RELATED APPLICATION

This application claims benefit of U.S. Provisional Patent Application No. 63/157,540, titled "A Novel Wrap-Around Contact for Low Resistivity," filed on Mar. 5, 2021, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, gate-all-around FETs, and finFETs. Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
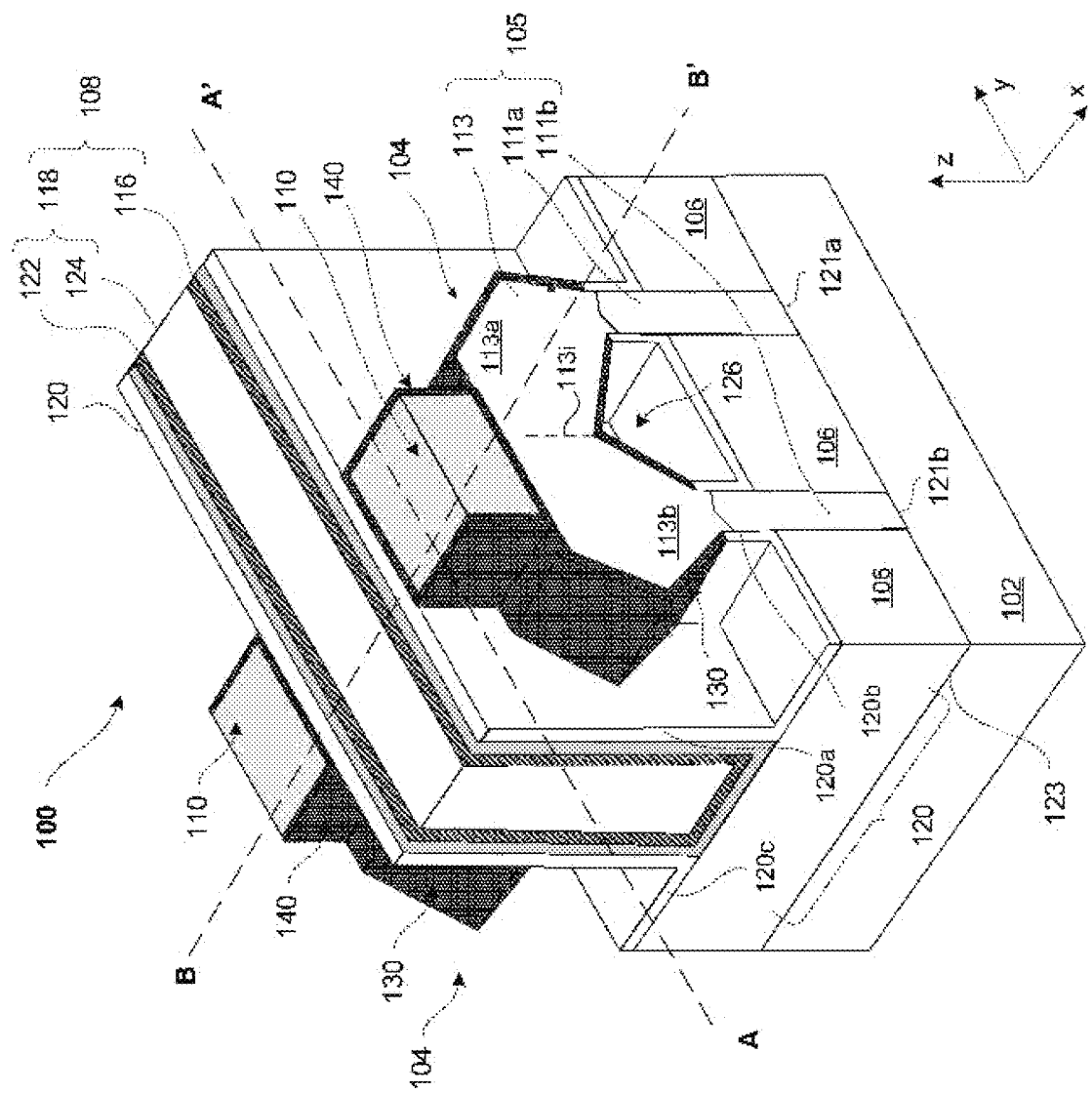
FIG. 1 is an isometric view of exemplary FETs, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with some embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As semiconductor devices are shrinking to smaller die size to reduce manufacturing cost and increase transistor density, low resistance in contacts and interconnects becomes a critical factor for device performance. Due to aggressive scaling of critical dimensions and using barrier layers, resistivity performance is impacted by contact resistivity between source/drain (S/D) epitaxial region (EPI) to silicide, liner resistivity, and surface scattering effect. S/D contact resistivity, contact plug resistance, via, and interconnect resistance have become critical in advanced nodes (e.g., 5 nm process node size, 2 nm process node size, and other process node sizes). For example, an about 30% node-to-node scaling reduction may result an about 40% increasing of the silicide—active area contact resistance $R_{csd}$.

Titanium silicide ($TiSi_x$) can be used in the formation of n-type FET (NFET) and p-type FET (PFET). Since the work function of $TiSi_x$ is close to Si mid-gap, the use of $TiSi_x$ can result in a higher contact resistance. To reduce a Schottky barrier height (SBH), dual silicides—instead of $TiSi_x$—can be used, but there is no manufacturing solution for a thermally stable n-type silicide on n-type epitaxial layer or p-type silicide on p-type epitaxial layer. Further, it is feasible to wrap a conductive layer around the epitaxial layer to increase contact area due to thermal stability. That is, if a silicide layer is formed after forming the S/D EPI, the silicide layer may not withstand the thermal during subsequent processes for forming inter layer dielectric (ILD) and/or replacement poly silicon gate (RPG), which may result in phase degradation and a resistivity increase.

This disclosure provides exemplary S/D EPI structures and S/D contacts wrapped with graphene (Gr) layers in fin structures of FETs (e.g., finFETs and/or gate-all-around FETs). This disclosure also provides exemplary methods for wrapping Gr layers to S/D EPI structures and S/D contacts to achieve lower SBH by SBH tuning and lower contact resistivity by increasing contact area. For example, a Gr layer can be formed to wrap S/D EPI structures to reduce S/D contact resistivity by SBH tuning. As another example, a Gr layer formed to wrap S/D contacts can act as a high conductivity liner to reduce parasitic resistance and act as a diffusion barrier to reduce surface elastic scattering by metal encapsulation in the Gr layer. The Gr layer has a reduced thickness which allows increased volumes of the formed S/D EPI structures and S/D contacts, resulting in increased contact areas to further reduce contact resistivity.

FIG. 1 is an isometric view of an exemplary FET 100 in an integrated circuit after a gate replacement process. In some embodiments, FET 100 can be a finFET (shown in FIGS. 2-3) or a gate-all-around FET (GAA FET; shown in FIG. 14). FIG. 1 is for illustrative purposes and is not drawn to scale. FET 100 includes a fin structure 104 formed on a substrate 102, shallow trench isolation (STI) regions 106, a gate structure 108 disposed on fin structure 104, S/D contacts 110, and spacer 120. FIG. 1 is taken after formation of gate structure 108 in a gate replacement process. FIG. 1 shows one gate structure 108. However, there may be additional gate structure(s) (not shown) similar and parallel to gate structure 108. In addition, FET 100 may be incorporated into the integrated circuit through the use of other structural components, such as gate contacts, vias, interconnect metal layers, dielectric layers, and passivation layers, that are omitted for the sake of clarity.

Substrate 102 is a physical material on which FETs 100 are formed. Substrate 102 includes a semiconductor material, such as silicon, germanium, a compound semiconductor including silicon carbide, gallium arsenide, gallium phosphide, indium phosphide, indium arsenide, indium antimonide, an alloy including silicon germanium carbide, silicon germanium, gallium arsenic phosphide, gallium indium phosphide, gallium indium arsenide, gallium indium arsenic phosphide, aluminum indium arsenide, aluminum gallium arsenide, and a combination thereof. In some embodiments, substrate 102 includes a crystalline silicon substrate (e.g., a silicon wafer). In some embodiments, substrate 102 includes an EPI and/or a silicon-on-insulator (SOI) structure. Further, substrate 102 may be doped with p-type dopants, such as boron, indium, aluminum, and gallium, or n-type dopants, such as phosphorus (P) and arsenic (As). The doped substrate 102 may be used for an n-type FET, or alternatively used for a p-type FET.

STI regions 106 provide electrical isolation of fin structure 104 from neighboring active and passive elements (not illustrated in FIG. 1) integrated with or deposited onto substrate 102. STI regions 106 are made of dielectric material. In some embodiments, STI regions 106 include silicon oxide, silicon nitride, silicon oxynitride, fluorine-doped silicate glass (FSG), a low-k dielectric material, and/or other suitable insulating material. In some embodiments, STI regions 106 include a multi-layer structure.

Gate structure 108 traverses fin structure 104. Fin structure 104 underlying gate structure 108 define the channel regions of FETs 100. Gate structure 108 includes a gate electrode 118 and a gate insulating structure 116 adjacent to and in contact with gate electrode 118. Gate structure 108 may further include capping layers, etch stop layers, and/or other suitable materials.

Gate insulating structure 116 traverses fin structure 104. In some embodiments, gate insulating structure 116 includes one or more layers of silicon oxide, silicon nitride, silicon oxynitride, or high-k dielectric materials, such as hafnium oxide (HfO2), titanium dioxide (TiO2), hafnium zirconium oxide (HfZrO), tantalum oxide (Ta2O3), hafnium silicate (H116fSiO4), zirconium dioxide (ZrO2), zirconium silicate (ZrSiO2), and a combination thereof. As used herein, the term "high-k" refers to a high dielectric constant. In the field of semiconductor device structures and manufacturing processes, high-k refers to a dielectric constant that is greater than the dielectric constant of SiO2 (e.g., greater than about 3.9). Alternatively, high-k dielectric materials may include metal oxides. Examples of metal oxides used for high-k dielectrics include oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), erbium (Eu), gadolinium (Gd), terbium (Tb), dysprosium (Dy), holmium (Ho), europium (Er), thulium (Tm), ytterbium (Yb), lutetium (Lu), and/or mixtures thereof. In some embodiments, gate insulating structure 116 includes a single layer or a stack of insulating material layers. Gate insulating structure 116 may be formed by chemical vapor deposition (CVD), atomic layer deposition (ALD), physical vapor deposition (PVD), e-beam evaporation, or other suitable process. Spacer 120 includes an insulating material, such as silicon oxide and silicon nitride, and protects the underlying regions during subsequent processing of the FETs. Spacer 120 includes spacer portions 120a that form sidewalls of gate structure 108, spacer portions 120b that form sidewalls of fin structure 104, and spacer portions 120c that form protective layers on STI regions 106.

Gate electrode 118 may include a gate work function metal layer 122 and a gate metal fill layer 124. In some embodiments, gate work function metal layer 122 is disposed on gate insulating structure 116. Gate work function metal layer 122 may include a single metal layer or a stack of metal layers. The stack of metal layers may include metals having work functions similar to or different from each other. In some embodiments, gate work function metal layer 122 includes any suitable material, such as aluminum (Al), copper (Cu), tungsten (W), titanium (Ti), tantalum (Ta), titanium nitride (TiN), tantalum nitride (TaN), nickel monosilicide (NiSi), cobalt monosilicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and combinations thereof. Exemplary work function metal(s) that may be included in gate work function metal layer 122 in a p-type device include TiN, TaN, ruthenium (Ru), molybdenum (Mo), Al, WN, zirconium silicide (ZrSi2), molybdenum silicide (MoSi2), tantalum silicide (TaSi2), nickel silicide (NiSi2), other suitable p-type work function metals, or combinations thereof. Exemplary work function metal(s) that may be included in work function metal layer 122 in an n-type device include Ti, Ag, TaAl, TaAlC, TiAlN, TaC, TaCN, TaSiN, Mn, Zr, other suitable n-type work function materials, or combinations thereof. Gate work function metal layer 122 may be formed using a suitable process, such as ALD, CVD, PVD, plating, and combinations thereof.

Gate metal fill layer 124 may include a single metal layer or a stack of metal layers. The stack of metal layers may include metals different from each other. In some embodiments, gate metal fill layer 124 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and combinations thereof. Gate metal fill layer 124 may be formed by ALD, PVD, CVD, or other suitable conductive material deposition process.

Fin structure 104 includes epitaxial regions (EPI) 105 disposed on both opposing sides of gate structure 108. Fin regions of fin structure 104 underlying gate structure 108 are regions formed from patterned portions of substrate 102, as described in detail below. EPIs 105 may form interfaces 121a and 121b with substrate 102 and interfaces (not shown) with regions of fin structure 104 underlying gate structure 108. In some embodiments, interfaces 121a and 121b are coplanar with interfaces 123 formed between STI regions 106 and substrate 102. In some embodiments, interfaces 121a and 121b are either above or below the level of interfaces 123.

EPIs 105 are configured to function as S/D regions of FET 100 and include epitaxially-grown semiconductor material. In some embodiments, the epitaxially-grown semiconductor material is the same material as the material of substrate 102. In some embodiments, the epitaxially-grown semiconductor material includes a different material from the material of substrate 102 and imparts a strain on the channel regions underlying gate structure 108. The epitaxially-grown semiconductor material may include semiconductor material, such as germanium and silicon; compound semiconductor materials, such as gallium arsenide, and aluminum gallium arsenide; or a semiconductor alloy, such as silicon germanium and gallium arsenide phosphide.

In some embodiments, EPIs 105 are grown by CVD, e.g., low pressure chemical vapor deposition (LPCVD), atomic layer chemical vapor deposition (ALCVD), ultra-high vacuum chemical vapor deposition (UHVCVD), remote plasma chemical vapor deposition (RPCVD); molecular beam epitaxy (MBE) processes; any suitable epitaxial process; or any combinations thereof. In some embodiments, EPIs 105 are grown by an epitaxial deposition/partial etch process, which repeats the epitaxial deposition/partial etch process at least once. Such repeated deposition/partial etch process is also called a cyclic deposition-etch (CDE) process. In some embodiments, EPIs 105 are grown by selective epitaxial growth (SEG), where an etching gas is added to promote the selective growth of semiconductor material on the exposed surfaces of substrate 102, but not on insulating material (e.g., dielectric material of STI regions 106).

Further, EPIs 105 may be in-situ doped during the epitaxial growth process or by an ion implantation process after the epitaxial growth process. In some embodiments, EPIs 105 may be doped with p-type dopants, such as boron, indium, and gallium; n-type dopants, such as phosphorus and arsenic; and/or combinations thereof. Silicon-germanium (SiGe) EPIs 105 may be doped with p-type or n-type dopants, and/or combinations thereof. Si EPIs 105 may be doped with carbon and/or phosphorous. For p-type in-situ doping, p-type doping precursors, such as diborane ($B_2H_6$) and boron trifluoride ($BF_3$), can be used. For n-type in-situ doping, n-type doping precursors, such as $PH_3$ and $AsH_3$, can be used.

Each of EPIs 105 may include sub-regions 111a, 111b, and 113. Sub-regions 111a and 111b are epitaxially grown on different portions of substrate 102 and form respective interfaces 121a and 121b with substrate 102. As shown in FIG. 1, merged sub-region 113 may include portions 113a, and 113b, which are epitaxially grown from respective unmerged sub-regions 111a and 111b and are merged at interface 113i. Fin structure 104 may be referred to as "a merged fin structure" because of its merged epitaxial portions 113a and 113b. In some embodiments, a top surface of EPIs 105 may be a (100) crystal plane of sub-regions 113.

In some embodiments, sub-regions 311 and 313 have SiGe and can differ from each other based on, for example, doping concentration, epitaxial growth process conditions, and/or relative concentration of germanium (Ge) with respect to silicon (Si). For example, an atomic percent Ge in sub-region 311 is less than an atomic percent Ge in sub-region 313. In some embodiments, the atomic percent Ge in sub-region 311 is substantially equal to the atomic percent Ge in sub-region 313. In some embodiments, sub-region 311 can include Ge in a range from about 15 atomic percent to about 35 atomic percent, while sub-region 313 includes Ge in a range from about 35 atomic percent to about 70 atomic percent with any remaining atomic percent being Si.

Sub-regions 111a, 111b, and 113 may be epitaxially grown under a pressure of about 10 Torr to about 300 Torr, at a temperature of about 500° C. to about 700° C. using reaction gases, such as hydrogen chloride (HCl) as an etching agent, germane (GeH4) as a germanium (Ge) precursor, dichlorosilane (SiH2Cl2 or DCS) and/or silane (SiH4) as a silicon (Si) precursor, B2H6 as boron (B) dopant precursor, hydrogen (H2), and/or nitrogen (N2). To achieve different concentrations of Ge in sub-regions 111a, 111b, and 113, the ratio of flow rate of Ge to Si precursors may be varied during their respective growth process.

Sub-regions 111a, 111b, and 113 may have varying dopant concentration with respect to each other. For example, sub-regions 111a and 111b may be undoped or each may have a dopant concentration lower than the dopant concentrations of sub-region 113. In some embodiments, sub-regions 111a and 111b each have a dopant concentration less about 5×1020 atoms/cm3, while sub-region 113 has a dopant concentration in a range from about $1\times10^{20}$ atoms/cm$^3$ to about $3\times10^{21}$ atoms/cm$^3$. In some embodiments, sub-region 113 may have a gradient dopant concentration.

An insulating material (e.g., air) with void 126 is included within FET 100. Void 126 may bound by portions of sub-regions 111a, 111b, and 113, STI region 106, and spacer 120. The cross-sectional profile of void 126 is not limited to the pentagon shape shown in FIG. 1, but may have any suitable geometric shape (e.g., circular, triangular, rectangular).

A first graphene (Gr) film 130 (also referred to as "first carbon layer"), comprising one or more layers of carbon atoms, can be formed to wrap the outside surfaces of S/D regions (e.g., EPIs 105) of FET 100. For example, first Gr film 130 can cover the top surfaces and sides surfaces of sub-regions 113 of EPIs 105 that are not covered by spacer portions 120b, as shown in FIG. 1. By wrapping first Gr film 130 to the outside surfaces of the S/D regions (e.g., EPIs 105) of FET 100, the S/D contact resistivity can be reduced by SBH tuning. A thickness of first Gr film 130 can be in a range from about 0.3 nm to about 5 nm. In some embodiments, the thickness of portions of the first Gr film 130 in void 126 can be thinner than the thickness of portions of the first Gr film 130 on the top surfaces and outer sides surfaces of sub-regions 113 of EPIs 105.

S/D contacts 110 can be formed on EPIs 105 and between S/D regions of FET 100 and metal layers (not shown). Each S/D contact 110 can include a single metal layer or a stack of metal layers. The stack of metal layers may include metals different from each other. In some embodiments, S/D contact 110 includes any suitable conductive material, such as Co, W, Ru, Ti, Ag, Al, TiAlN, TaC, TaCN, TaSiN, Mn, Zr, TiN, TaN, Mo, WN, Cu, Ni, TiC, TiAlC, TaAlC, metal alloys, and combinations thereof. S/D contacts 110 may be formed by ALD, PVD, CVD, or other suitable conductive material deposition process.

A second Gr film 140 (also referred to as "second carbon layer"), comprising one or more layers of carbon atoms, can be formed to wrap the outside surfaces of S/D contacts 110 of FET 100. For example, second Gr film 140 can cover the bottom surface and sidewalls of S/D contacts 110, as shown in FIG. 1. Second Gr film 140 can act as a high conductivity liner due to the superconductivity property of graphene to reduce surface elastic scattering to parasitic resistance and can also act as a diffusion barrier to suppress metal diffusion from S/D contacts 110 to surrounding dielectric to reduce surface elastic scattering. In some embodiments, a bottom surface of second Gr film 140 can be located within the S/D regions (e.g., EPI 113). A thickness of second Gr film 140 can be in a range from about 0.3 nm to about 5 nm.

The thicknesses of first Gr film 130 and second Gr film 140 are determined by the numbers of carbon atom layers of first Gr film 130 and second Gr film 140 respectively. In some embodiments, the layers of carbon atoms are formed less than or equal to about 10 layers to control the total thickness of first Gr film 130 and second Gr film 140 between about 0.3 nm and about 5 nm. Since the thickness of second Gr film 140 is much less than the thickness of ordinary Ta/TaN liner and/or barrier used in other devices, thus allows more volume for S/D contacts 110. If the thickness of Gr film 140 is below 0.3 nm, Gr film 140 may not adequately reduce contact resistance between S/D contacts and S/D regions of FET 100. On the other hand, if the thickness of Gr film 140 is above 5 nm, the device size increases, and consequently, increases device manufacturing cost. In some embodiments, the number of layers of carbon atoms of first Gr film 130 can be determined based on structure stability of the interface between the first Gr film 130 and EPIs 105, and the number of layers of carbon atoms of second Gr film 140 can be determined based on structure stability of the interface between the second Gr film 140 and S/D contacts 110. For example, if the material of a S/D contact is Ni or Ru, a multi-layer (e.g., bilayer, triple-layer, or four-layer) graphene can be used as the liner.

Figure 2:
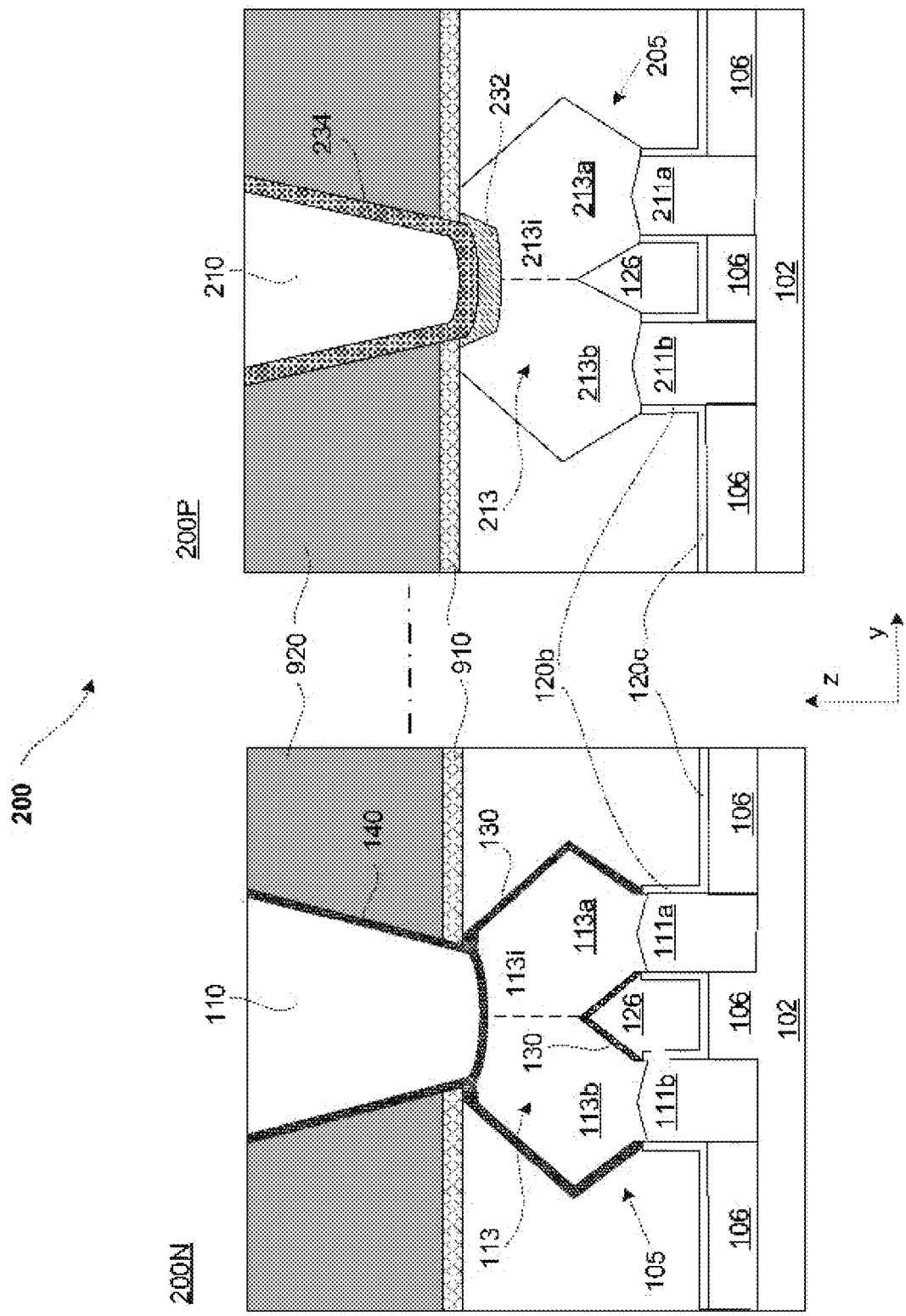
FIG. 2 is a cross-sectional view of exemplary FETs, in accordance with some embodiments of the present disclosure.
Figure 3:
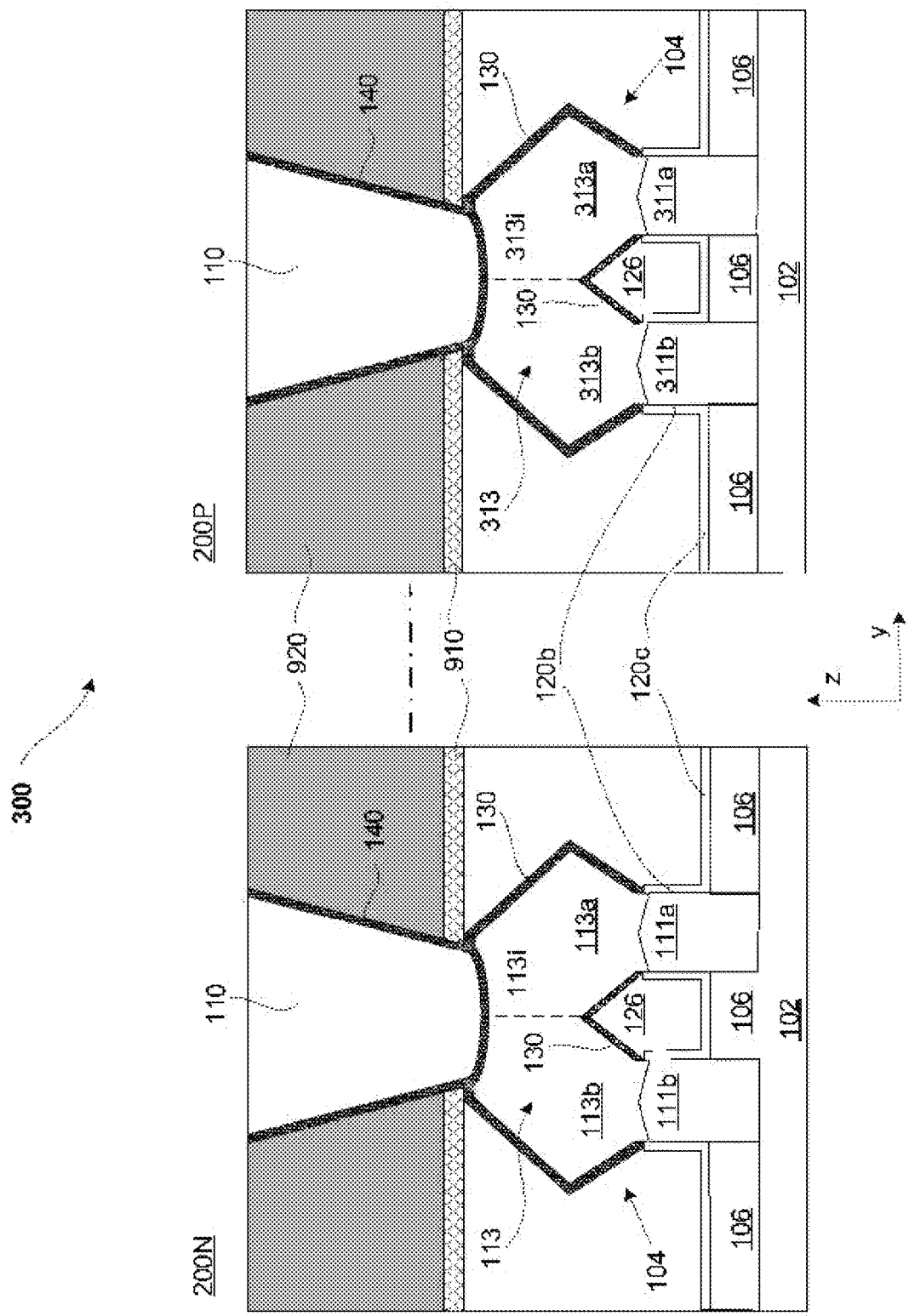
FIG. 3 is a cross-sectional view of exemplary FETs, in accordance with some embodiments of the present disclosure.

First Gr film 130 and second Gr film 140 can be used in either NFET or PFET or both NFET and PFET, according to some embodiments. FIGS. 2 and 3 illustrate two exemplary FETs, in accordance with some embodiments of the present disclosure. Referring to FIG. 2, an NFET 200N and a PFET 200P are illustrated in a cross-sectional view along a line A-A' as shown in FIG. 1. NFET 200N is the same as the isometric view of FET as shown in FIG. 1, in which sub-region 113 of EPI 105 can be a Si epitaxial region doped with n-type type dopants (e.g., phosphorus and arsenic). First Gr film 130 can be formed to wrap the exposed surfaces of sub-region 113 of EPI 105 of NFET 200N. Second Gr film 140 is formed on a bottom surface and sidewalls of S/D contact 110 of NFET 200N. PFET 200P includes sub-regions 211a, 211b, and 213 of EPI 205, which can be a SiGe epitaxial region doped with p-type type dopants (e.g., boron, indium, and gallium). Sub-region 213 can include portions 213a and 213b coupled at an interface 213i. PFET 200P can further include a barrier 232 including p-type metal silicide (e.g., TiSix) formed in a recess of sub-region 213 of EPI 205, and a liner 234 (e.g., TiN and TaN) formed on a bottom surface and sidewalls of S/D contact 210. In some embodiments, first Gr film 130 and second Gr film 140 may also be formed in PFET, while NFET uses silicide as the barrier and uses metal nitride as the liner. Referring to FIG. 3, both NFET 300N and PFET 300P include first Gr films 130 and second Gr film 140. As shown in FIG. 3, PFET 200P includes sub-regions 311a, 311b, and 313, which can include portions 313a and 313b coupled at an interface 313i.

Figure 14:
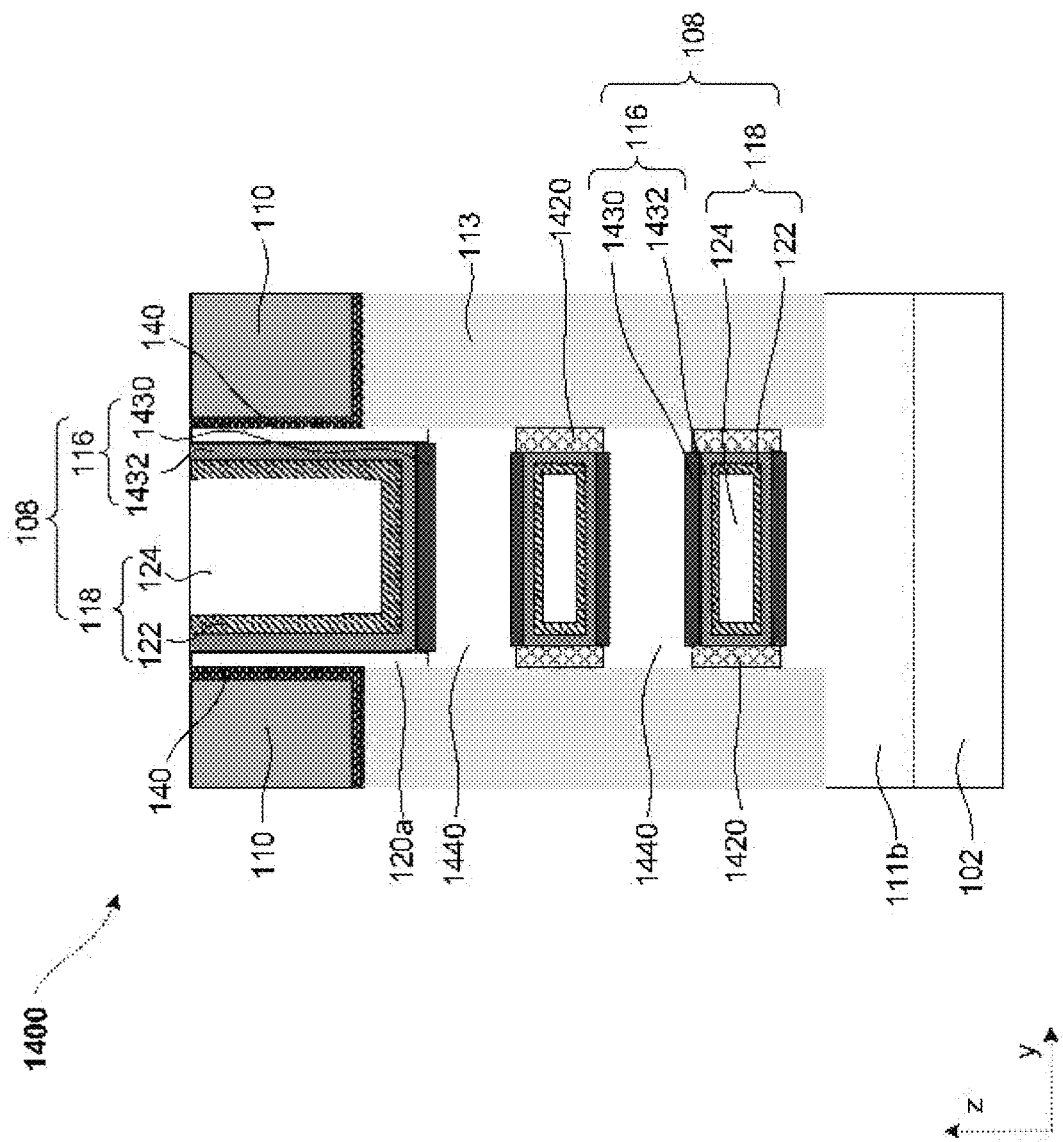
FIG. 14 is a cross-sectional view of an exemplary GAA FET, in accordance with some embodiments of the present disclosure.

The first Gr film 130 and second Gr film 140 can be used in gate-all-around FETs (GAA-FETs). FIG. 14 is a cross-sectional view of exemplary GAA-FET 1400 along BB' direction as shown in FIG. 1, in accordance with some embodiments of the present disclosure. As shown in FIG. 14, GAA-FET 1400 can include (i) stacks of nanostructured channel regions 1440 disposed on fin structure 111b, (ii) gate structures 108 disposed on and wrapped around nanostructured channel regions 1440, (iii) epitaxial S/D regions 113, (iv) inner spacers 1420, (v) first Gr film 130 (not shown in FIG. 14) and second Gr film 140, and (vi) S/D contact 110. As used herein, the term "nanostructured" defines a structure, layer, and/or region as having a horizontal dimension (e.g., along an x- and/or y-axis) and/or a vertical dimension (e.g., along a z-axis) less than about 100 nm, for example about 90 nm, about 50 nm, about 10 nm, or other values less than about 100 nm are within the scope of the disclosure.

Nanostructured channel regions 1440 can include semiconductor materials similar to or different from substrate 102 and can include semiconductor material similar to or different from each other. In some embodiments, nanostructured channel regions 1440 can include Si, silicon arsenic (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials.

Though two nanostructured channel regions 1440 are shown in each stack, GAA-FET 1400 can include any number of nanostructured channel regions 1440 in each stack. Though rectangular cross-sections of nanostructured channel regions 1440 are shown, nanostructured channel regions 1440 can have cross-sections of other geometric shapes (e.g., circular, elliptical, triangular, or polygonal).

For n-type GAA-FET 1400, S/D regions 113 can include an epitaxially-grown semiconductor material, such as Si, and n-type dopants, such as phosphorus and other suitable n-type dopants. For p-type GAA-FET 1400, S/D regions 113 can include an epitaxially-grown semiconductor material, such as Si and SiGe, and p-type dopants, such as boron and other suitable p-type dopants.

Gate structures 108 can be multi-layered structures and can surround nanostructured channel regions 1440, for which gate structures 108 can be referred to as "gate-all-around (GAA) structures" or "horizontal gate-all-around (HGAA) structures." Gate structures 108 surrounding nanostructured channel regions 1440 can be electrically isolated from adjacent S/D regions 113 by inner spacers 1420. Gate structure 108 disposed on the stacks of nanostructured channel regions 1440 can be electrically isolated from adjacent S/D regions 113 by spacers portions 120a. Inner spacers 1420 and spacer portions 120a can include an insulating material, such as SiO2, SiN, SiCN, SiOCN, and other suitable insulating materials.

In some embodiments, gate lengths of gate structures 108 are substantially equal to each other. Gate structures 108 can include (i) gate insulating structures 116, (ii) gate work function metal (WFM) layers 122 disposed on gate insulating structures 116, and (iii) gate metal fill layers 124 disposed on WFM layers 122. In some embodiments, gate structure 108 can further include glue layers (not shown) between WFM layers 122 and gate metal fill layers 124 for better adhesion of gate metal fill layers 124 to WFM layers 122. The glue layers can include titanium nitride (TiN), tantalum nitride (TaN), molybdenum nitride (MoN), tungsten nitride (WN), or other suitable metal nitrides. Though FIG. 14 shows that all the layers of gate structures 108 are wrapped around nanostructured channel regions 1440, nanostructured channel regions 1440 can be wrapped around by at least gate insulating structures 116. Accordingly, nanostructured channel regions 1440 can be electrically isolated from each other to prevent shorting between gate structures 108 and S/D regions 113 during operation of GAA-FET 1400.

In some embodiments, each gate insulating structure 116 can include interfacial oxide (IO)) layer 1430 and high-k (HK) gate dielectric layer 1432. IO layer 1430 can be formed by oxidizing the surfaces of nanostructured channel regions 1440, and can include an oxide of the semiconductor material in nanostructured channel regions 1440. HK gate dielectric layer 1432 can include (i) a HK dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (ii) a HK dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) a combination thereof, or (iv) other suitable HK dielectric materials. As used herein, the term "high-k (HK)" refers to a high dielectric constant. In the field of semiconductor device structures and manufacturing processes, HK refers to a dielectric constant that is greater than the dielectric constant of $SiO_2$ (e.g., greater than 3.9).

For n-type GAA-FET 1400, WFM layers 122 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For p-type GAA-FET 1400, WFM layers 122 can include substantially Al-free (e.g., with no Al) conductive materials, such as titanium nitride (TiN), titanium carbon nitride (TiCN), titanium silicon nitride (TiSiN), titanium gold (Ti—Au) alloy, titanium copper (Ti—Cu) alloy, tantalum nitride (TaN), tantalum carbon nitride (TaCN), tantalum silicon nitride (TaSiN), tantalum gold (Ta—Au) alloy, tantalum copper (Ta—Cu), tungsten nitride (WN), tungsten carbon nitride (WCN), other suitable substantially Al-free conductive materials, and a combination thereof.

In some embodiments, gate metal fill layers 124 can include conductive materials with low resistivity (e.g., resistivity about 50 μΩ-cm, about 40 μΩ-cm, about 30 μΩ-cm, about 20 μΩ-cm, or about 10 μΩ-cm), such as cobalt (Co), tungsten (W), ruthenium (Ru), iridium (Ir), copper (Cu), molybdenum (Mo), other suitable conductive materials with low resistivity, and a combination thereof.

As described above in connection with FIGS. 1-3 and 14, the first Gr film 130 (not shown in FIG. 14) can be formed to cover the exposed surfaces of EPI 113 that are not covered by spacers. As shown in FIG. 14, second Gr film 140 can be formed on a top surface of S/D regions 113 and on a sidewall of spacers portions 120a. S/D contact 110 can be formed on second Gr film 140. It is noted that, first Gr film 130 and second Gr film 140 can be used in either n-type GAA-FET or p-type GAA-FET or both n-type GAA-FET and p-type GAA-FET, according to some embodiments. By wrapping first Gr film 130 to the outside surfaces of EPI 113, the S/D contact resistivity can be reduced by SBH tuning. Second Gr film 140 can cover the bottom surface and sidewalls of S/D contacts 110, as shown in FIG. 14. Second Gr film 140 can act as a high conductivity liner due to the superconductivity property of graphene to reduce surface elastic scattering to parasitic resistance and can also act as a diffusion barrier to suppress metal diffusion from S/D contacts 110 to surrounding dielectric to reduce surface elastic scattering. A thickness of second Gr film 140 can be in a range from about 0.5 nm to about 5 nm, such as about 0.5 nm to about 2 nm. The thickness of second Gr film 140 can be less than the thickness of ordinary Ta/TaN liner and/or barrier used in other devices, thus allowing more volume for S/D contacts 110 and increasing contact area to further reduce the contact resistivity.

Figure 12:
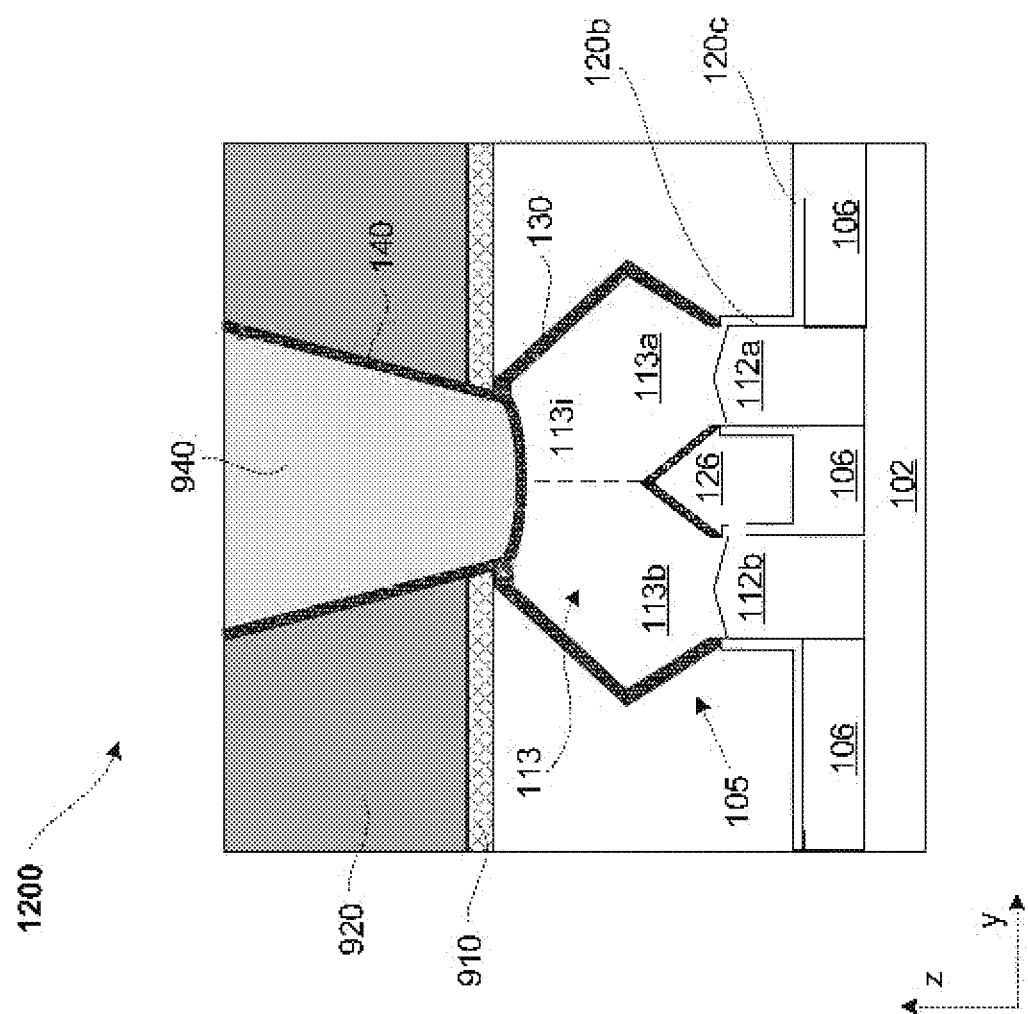
Figure 13:
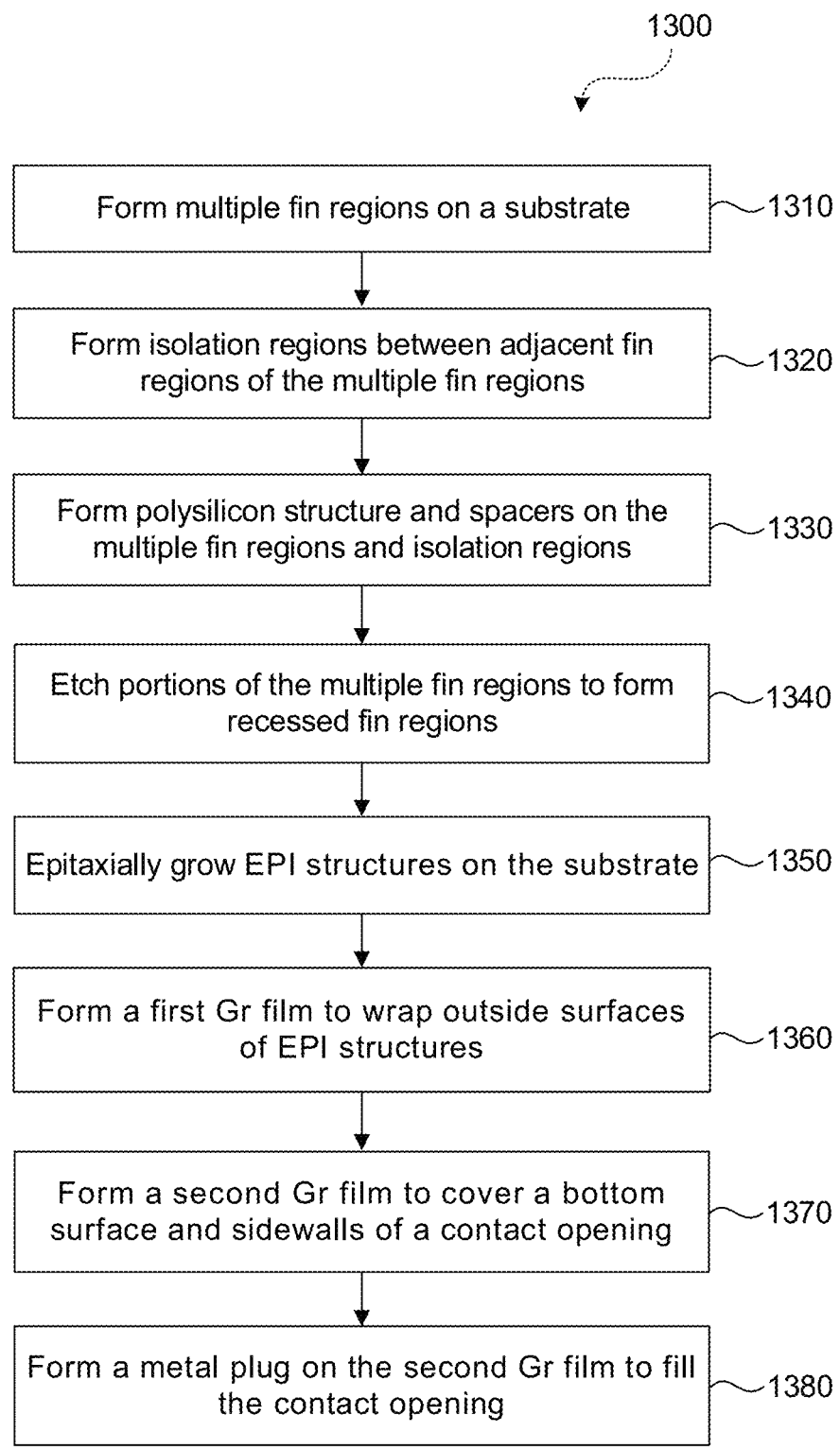
FIG. 13 is a flow diagram of an exemplary method for forming a FET structure, in accordance with some embodiments of the present disclosure.

FIG. 13 is a flow diagram of an exemplary method 1300 for fabricating a FET structure, according to some embodiments of the present disclosure. Solely for illustrative purposes, the operations illustrated in FIG. 13 will be described with reference to the example fabrication process illustrated in FIGS. 4-12. FIGS. 4-8 are isometric views of an exemplary FET structure at various fabricating stages of method 1300 shown in FIG. 13. FIGS. 9-12 are cross-sectional views an exemplary FET structure at various fabricating stages of method 1300 shown in FIG. 13. Operations can be performed in a different order or not performed depending on specific applications. It should be noted that method 1300 does not produce a complete FET structure. Accordingly, it is understood that additional processes may be provided before, during, and after method 1300, and that some other processes may only be briefly described herein.

As shown in FIG. 13, in operation 1310 of method 1300, multiple fin regions are formed on a substrate. Formation of the multiple fin regions may include patterning and etching of a substrate. The patterning may be performed by photolithographic processes and the etching may be performed by dry etching (e.g., RIE).

Figure 4:
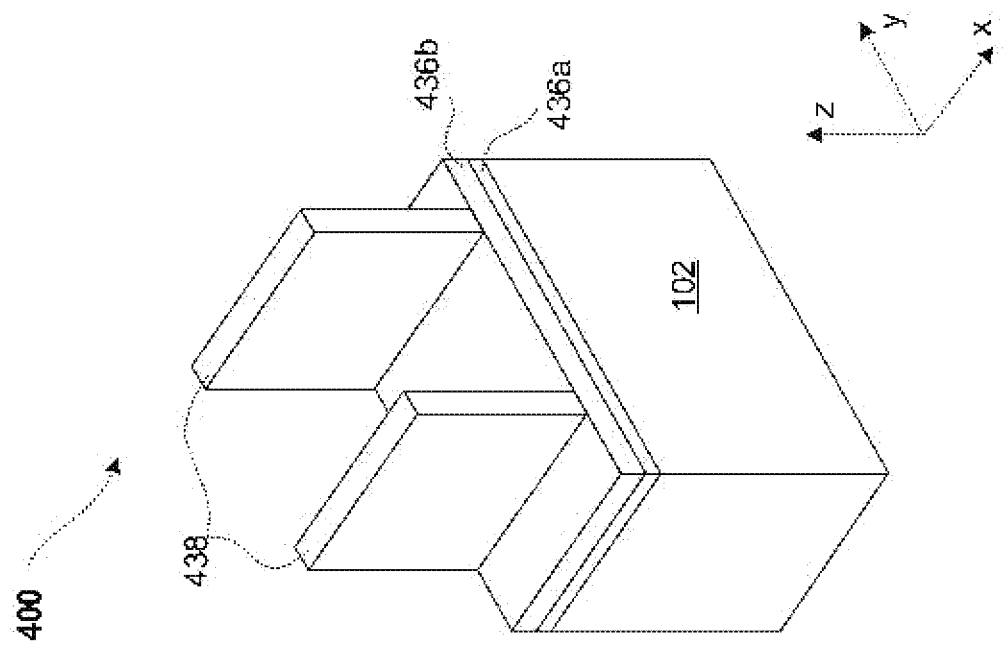

For example, FIG. 4 shows an isometric view of partially fabricated FET structure 400 after patterning photoresist on substrate 102 for formation of fin structures. A pad layer 436a and a hardmask layer 436b are formed on substrate 102. Pad layer 436a may be a thin film of silicon oxide formed, for example, using a thermal oxidation process. Pad layer 436a may also act as an etch stop layer for etching hardmask layer 436b. In some embodiments, hardmask layer 436b is formed of silicon nitride, for example, using LPCVD or PECVD. Hardmask layer 436b is used as a hard mask subsequent photolithography processes. A patterned photoresist layer 438 is formed on hardmask layer 436b.

Figure 5:
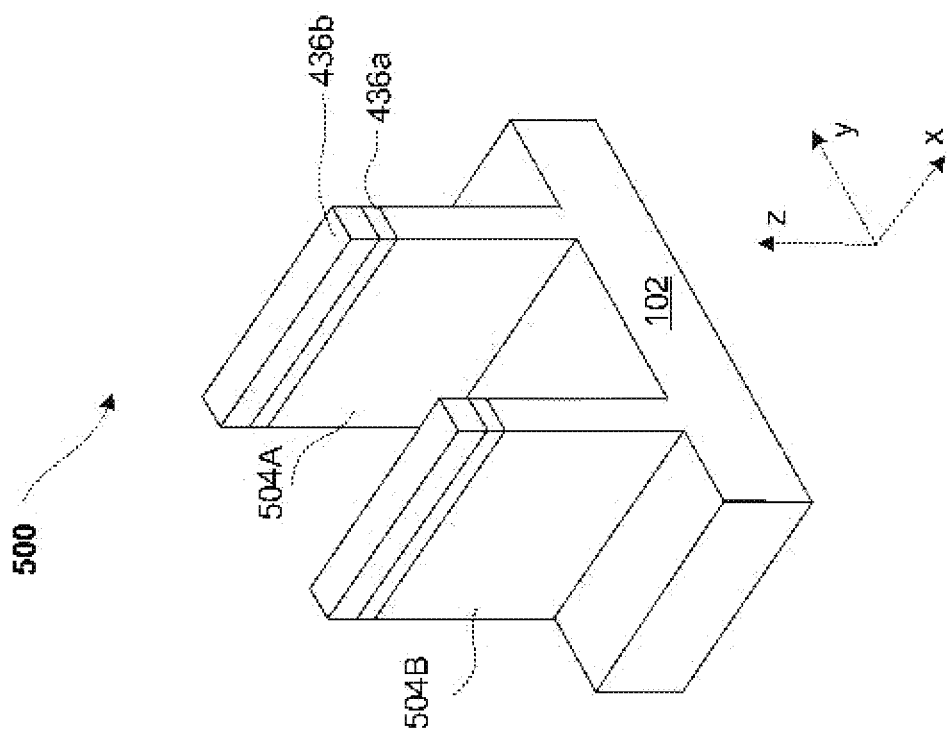
FIGS. 4-8 are isometric views of an exemplary FET structure at various fabricating stages, in accordance with some embodiments of the present disclosure.

FIG. 5 is an isometric view of partially fabricated FET structure 500 after the exemplary formation of fin regions 504A and 504B. Portions of hardmask layer 436b and pad layer 436a that are not covered by patterned photoresist layer 438 are etched to expose underlying substrate 102. The exposed substrate 102 is then etched to form fin regions 504A and 504B. Patterned photoresist layer 438 is then removed.

Figure 6:
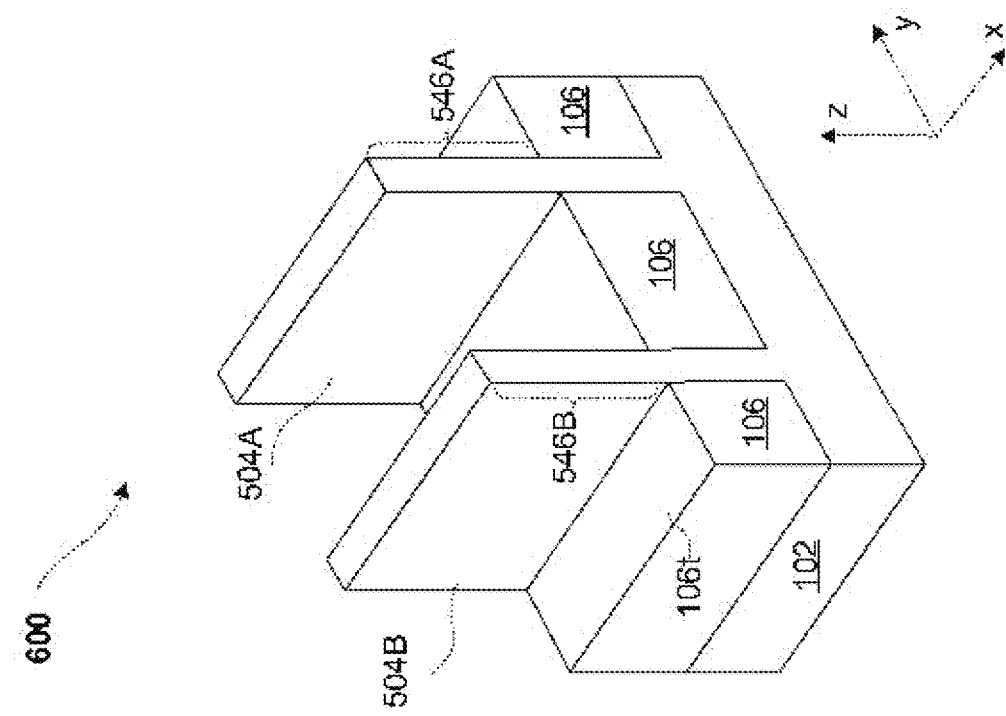

Referring back to FIG. 13, in operation 1320 of method 1300, isolation regions are formed on the substrate between adjacent fin regions of the multiple fin regions. For example, FIG. 6 is an isometric view of partially fabricated FET structure 600 after the exemplary formation of STI regions 106.

The formation of STI regions 106 involves deposition and etching of a dielectric material. The dielectric material may include silicon oxide. In some embodiments, other dielectric materials, such as silicon nitride, silicon oxynitride, fluoride-doped silicate glass (FSG), or a low-k dielectric material, may also be used. In some embodiments, the dielectric material may be formed using a flowable CVD (FCVD) process, a high-density-plasma (HDP) CVD process, using silane ($SiH_4$) and oxygen ($O_2$) as reacting precursors. In some embodiments, the dielectric material may be formed using a sub-atmospheric CVD (SACVD) process or high aspect-ratio process (HARP), where process gases may include tetraethoxysilane (TEOS) and/or ozone ($O_3$). In some embodiments, the dielectric material may be formed using a spin-on-dielectric (SOD), such as hydrogen silsesquioxane (HSQ) and methyl silsesquioxane (MSQ).

A chemical mechanical polishing or a wet etching is then performed to remove hardmask layer 436b and pad layer 436a. This removal is followed by an etching of the dielectric material deposited on substrate 102 to form STI regions 106, as shown in FIG. 6. Etching the dielectric material may be performed using a wet etching process, for example, by dipping substrate 102 in hydrofluoric acid (HF). Alternatively, the etching operation may be performed using a dry etching process, for example, using $CHF_3$ or $BF_3$ as etching gases. Upper fin portions 546A and 546B of fin regions 504A and 504B, respectively, protruding over flat top surfaces 106t of STI regions 106 are used to form channel regions of FET structure 600.

Figure 7:
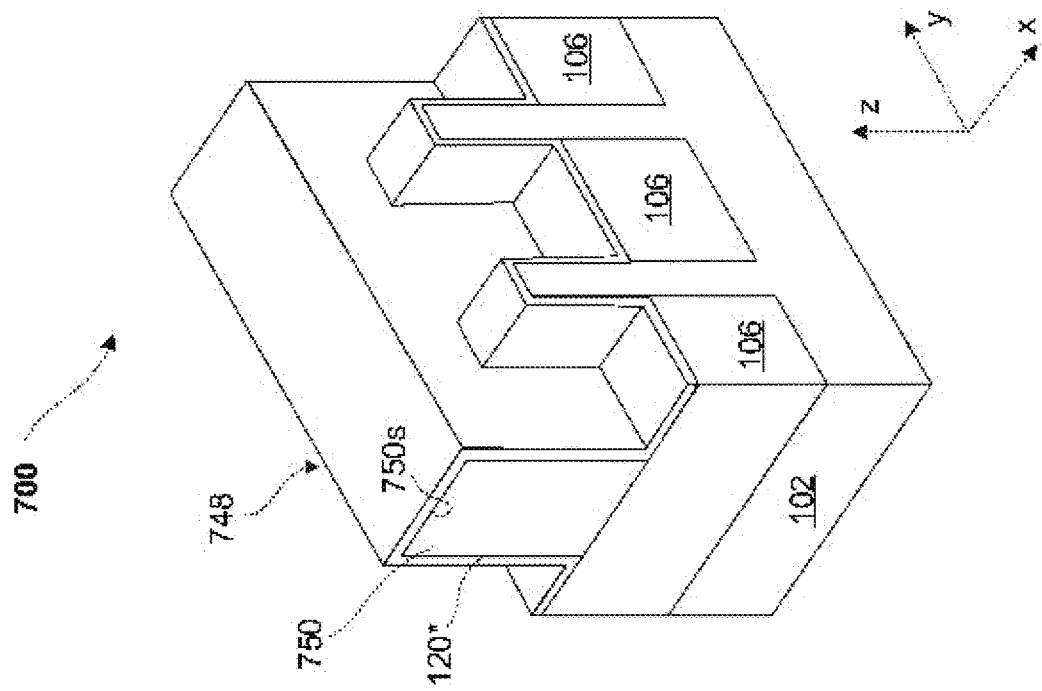

Referring back to FIG. 13, in operation 1330 of method 1300, a polysilicon structure and spacers are formed on the fin regions and isolation regions. For example, FIG. 7 is an isometric view of a partially fabricated FET structure 700 after the exemplary formation of a structure 748 on fin regions 504A and 504B and STI regions 106.

Structure 748 includes a patterned polysilicon structure 750 and unpatterned spacer 120*. Patterned polysilicon structure 750 is formed over top surfaces 106t of STI regions 106 and wrapped around surfaces of fin regions 504A and 504B protruding over STI regions 106. Unpatterned spacer 120* is disposed to blanket exposed surfaces of patterned polysilicon 750 (e.g., a top surface 750s of patterned polysilicon 750) and to blanket top surfaces 106t of STI regions 106 and surfaces of fin regions 504A and 504B protruding over STI regions 106 that are not covered by patterned polysilicon structure 750.

Patterned polysilicon structure 750 is formed by any suitable process. For example, patterned polysilicon structure 750 can be formed by a process including deposition, photolithography, and etching. Deposition processes include CVD, PVD, ALD, other suitable methods, and/or combinations thereof. Photolithography includes photoresist coating (e.g., spin-on coating), soft baking, mask aligning, exposure, post-exposure baking, developing the photoresist, rinsing, drying (e.g., hard baking), other suitable processes, and/or combinations thereof. Etching processes include dry etching, wet etching, and/or other etching methods (e.g., reactive ion etching). Unpatterned spacer 120* may include dielectric material such as silicon oxide, silicon carbide, silicon nitride, silicon oxy-nitride, or other suitable material. A blanket layer of a dielectric material may be formed over patterned polysilicon structure 750 by CVD, PVD, ALD, or other suitable technique followed by an anisotropic etching of the dielectric material to form spacer 120.

Referring back to FIG. 13, in operation 1340 of method 1300, the multiple fin regions are etched to form recessed fin regions. For example, FIG. 8 is an isometric view of partially fabricated FET structure 800 after the exemplary formation of spacer 120 and recessed fin regions 854A and 854B.

Figure 8:
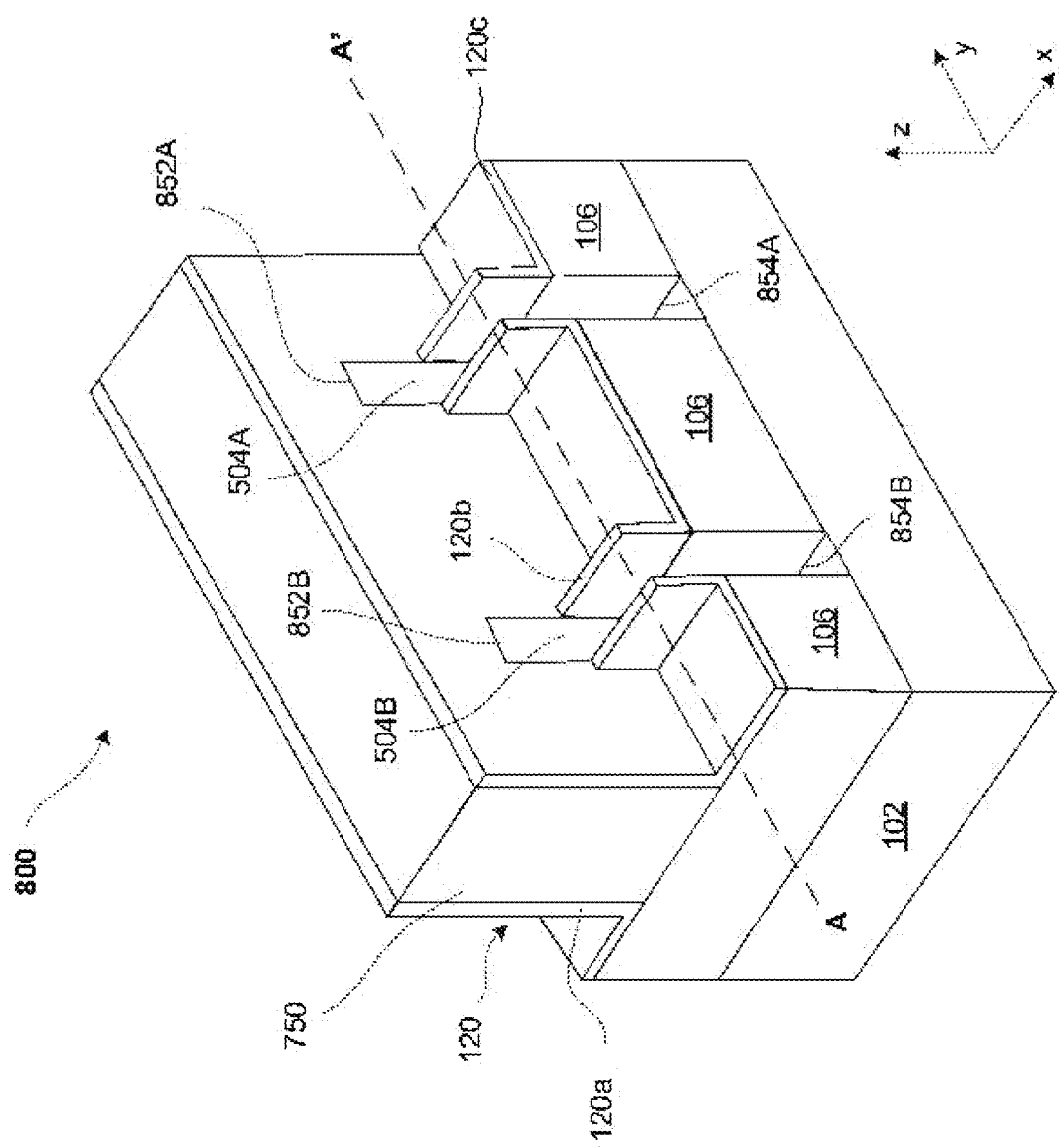

Unpatterned spacer 120* can be dry etched using, for example, reactive ion etching (RIE) to form spacer 120 having spacer portions 120a, 120b, and 120c as shown in FIG. 8. The portions of fin regions 504A and 504B that are not covered by patterned polysilicon structure 750 and spacer 120 are recessed to form recessed fin regions 854A and 854B. The unrecessed portions of fin regions 504A and 504B underlie spacer regions 120a and patterned polysilicon structure 750 and form respective interfaces 852A and 852B with spacer regions 120a and patterned polysilicon structure 750. In some embodiments, a biased etching process is performed to form recessed fin regions 854A and 854B. The etching process may be performed under a pressure of about 1 mTorr to about 1000 mTorr, a power of about 50 W to about 1000 W, a bias voltage of about 20 V to about 500 V, at a temperature of about 40° C. to about 60° C., and using a HBr and/or Cl2 as etch gases.

Figure 9:
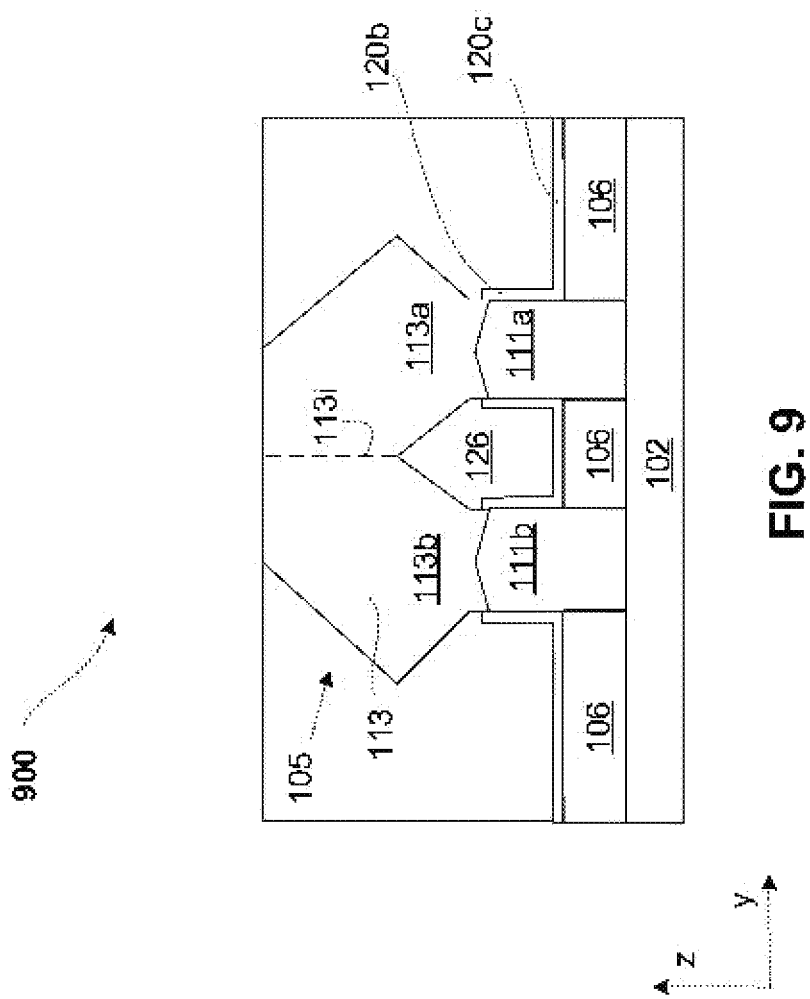
FIGS. 9-12 are cross-sectional views an exemplary FET structure at various fabricating stages, in accordance with some embodiments of the present disclosure.

Referring back to FIG. 13, in operation 1350 of method 1300, EPI structures are epitaxially grown on the substrate. For example, FIG. 9 is a cross-sectional view of partially fabricated FET structure 900 along line A-A' after the exemplary formation of an EPI 105. In some embodiments, forming EPI 105 includes epitaxially growing unmerged sub-regions 111a and 111b in the recessed fin regions 854A and 854B, and epitaxially growing a merged sub-region 113 is to couple unmerged sub-regions 111a and 111b. EPI structure 105 can function as a S/D region of FET structure 900.

Unmerged sub-regions 111a and 111b are epitaxially grown in the recessed fin regions 854A and 854B, respectively. Unmerged sub-regions 111a and 111b may include SiGe and may be epitaxially grown under a pressure of about 10 Torr to about 300 Torr, at a temperature of about 500° C. to about 700° C. using reaction gases such as HCl as an etching agent, GeH4 as Ge precursor, DCS and/or SiH4 as Si precursor, B2H6 as B dopant precursor, H2, and/or N2. Unmerged sub-regions 111a and 111b may be undoped or in-situ doped with p-type dopant (e.g., boron, indium, and gallium) or n-type dopants (e.g., phosphorus and arsenic) to have a dopant concentration in a range between about 4.5×1020 atoms/cm3 to about 5.5×1020 atoms/cm3.

Merged sub-region 113 includes portions 113a and 113b epitaxially grown on unmerged sub-regions 111a and 111b and coupled at interface 113i. Merged sub-region 113 may include SiGe and may be epitaxially grown under a pressure of about 10 Torr to about 300 Torr, at a temperature of about 500° C. to about 700° C. using reaction gases, such as HCl as an etching agent, GeH4 as Ge precursor, DCS and/or SiH4 as Si precursor, B2H6 as B dopant precursor, H2, and/or N2. Merged sub-region 113 may be in-situ doped with p-type dopant (e.g., boron, indium, or gallium) or n-type dopants (e.g., phosphorus and arsenic) to have a dopant concentration in a range from about $1 \times 10^{20}$ to about $2 \times 10^{21}$ atoms/cm$^3$.

Figure 10:
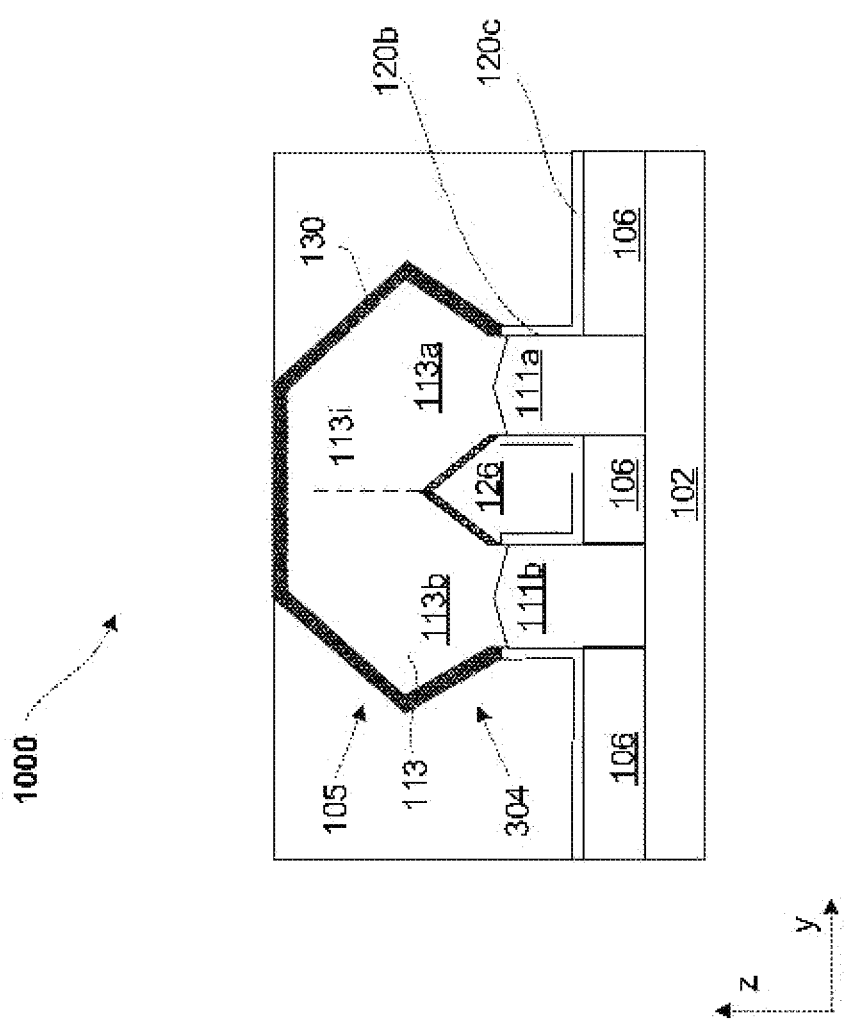

Referring back to FIG. 13, in operation 1360 of method 1300, a first Gr film is formed to wrap outside surfaces of EPI structures. For example, FIG. 10 is a cross-sectional view of partially fabricated FET structure 1000 along line A-A' after the exemplary formation of first Gr film 130.

In some embodiments, first Gr film 130 can be formed to wrap (or formed on) the outside surfaces of EPI 105 of FET structure 1000. For example, first Gr film 130 can be formed to cover the top surfaces and sides surfaces of merged sub-region 113 of EPIs 105 that are not covered by spacer portions 120b, as shown in FIG. 10. By wrapping first Gr film 130 to the outside surfaces of EPI 105, the S/D contact resistivity can be reduced by SBH tuning. In some embodiments, a thickness of first Gr film 130 can be in a range from about 0.02 nm to about 2 nm, such as about 0.1 nm to about 1 nm.

In some embodiments, before forming the first Gr film 130, a surface treatment can be performed to cover the top surfaces and sides surfaces of merged sub-region 113 of EPIs 105 that are not covered by spacer portions 120b to form an epitaxial termination interface (not shown). In some embodiments, the exposed surfaces of merged epitaxial sub-region 113 of EPIs 105 can be treated with non-deposited plasma products. The treated surface nucleates polysilicon and poly-SiGe. The surface treatment provides surface moieties susceptible to a subsequent carbon deposition reaction or susceptible to further surface treatment prior to carbon deposition.

In some embodiments, a process of forming the first Gr film 130 can include forming a graphene seeding layer to cover the epitaxial termination interface. It is noted that, the surface treatment is optional. If the surface treatment is omitted, the graphene seeding layer can also be formed on the top surfaces and sides surfaces of merged sub-region 113 of EPIs 105 that are not covered by spacer portions 120b. In some embodiments, the graphene seeding layer can be formed by a gas phase synthesis process by using 1,2,3,4-tetraphenylnaphthalene (TPN), Pyrene, or Benzene as the carbon source. For example, a thin conformal Gr seeding layer can be synthesized by sending an aerosol consisting of argon gas and liquid ethanol droplets into an atmospheric-pressured, microwave-generated argon plasma field. The ethanol droplets can be evaporated and dissociated in the plasma to form a Gr seeding layer that is clean and highly ordered with few lattice imperfections and oxygen functionalities, which can have improved seed characteristics for subsequent graphene growth.

After forming the graphene seeding layer to cover the outside surfaces of EPI 105 of FET structure 1000, any suitable method of activation and graphene growth, such as an ultraviolet (UV) cure, laser treatment, and thermal anneal, can be applied to the graphene seeding layer to form the conformal first Gr film 130, as shown in FIG. 10. In some embodiments, a heat treatment may be performed in an inert atmosphere of argon, nitrogen, or helium for solvent removal. For example, in a UV curing process, the graphene seeding layer can be irradiated by high-intensity ultraviolet light to rapidly cure the graphene atoms. As another example, a pulsed laser or a continuous wave laser source having a wavelength and intensity to heat the graphene seeding layer can be used in a laser treatment for activation and graphene growth. As yet another example, a thermal activation annealing process at an annealing temperature in a range from about 380° C. to about 450° C. (e.g., about 400° C.) can be performed to drive precipitation and growth of carbon atoms.

Referring back to FIG. 13, in operation 1370 of method 1300, a second Gr film is formed to cover a bottom surface and sidewalls of a contact opening. For example, FIG. 11 is a cross-sectional view of partially fabricated FET structure 1100 along line A-A' after the exemplary formation of second Gr film 140.

In some embodiments, an etch stop layer (ESL) 910 can be formed to cover a top surface of first Gr film 130, and an interlayer dielectric layer (ILD) 920 can be formed on ESL 910. ESL 910 can prevent over-etching due to a non-uniform topography of the FET from damaging the S/D regions (e.g., EPI 105) of FET structure 1100. ESL 910 can include a dielectric material that has a different etching rate than the material of EPI 105 and ILD 920, such as silicon nitride, silicon oxynitride, silicon carbide, and silicon carbonitride. ILD 920 may be formed of a dielectric material different from ESL 910, such as silica (Sift), hafnium silicate (Hf-SiO$_4$), zirconium silicate (ZrSiO$_4$), phospho-silicate glass (PSG), boro-silicate glass (BSG), boron-doped phospho-silicate glass (BPSG), undoped silicate glass (USG), and any other suitable insulation materials. ILD 920 may be deposited by any suitable method, such as CVD, plasma-enhanced CVD (PECVD), and flowable CVD (FCVD).

A contact opening 930 can be formed in ESL 910 and ILD 920 to expose a top surface of first Gr film 130. Contact opening 930 can be formed by any suitable patterning process. For example, a lithography process can be performed to pattern a mask for contact opening 930 and one or more subsequent wet or dry etching processes can be performed to etch a portion of ESL 910 and ILD 920 exposed by the patterned mask. A cleaning process, such as an ashing process and a strip process, can be performed after the etching to clean the sidewalls and bottom of contact opening 930.

Figure 11:
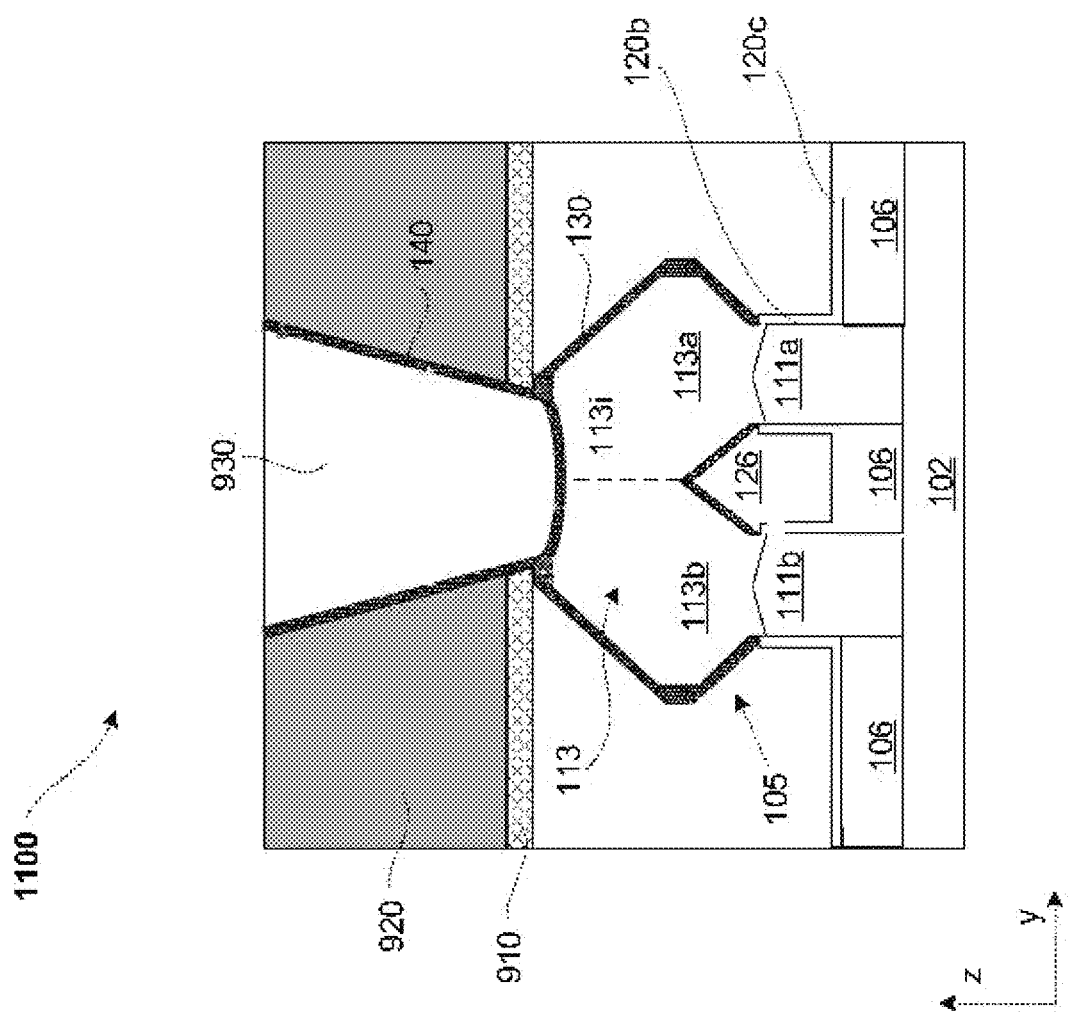

A second Gr film 140 can be formed to cover the bottom surface and sidewalls of contact opening 930, as shown in FIG. 11. Second Gr film 140 can be formed by a segregation and transfer process, or by a catalyst-assisted growth process. A thickness of second Gr film 140 can be in a range from about 0.02 nm to about 2 nm, such as about 0.1 nm to about 1 nm.

In some embodiments, in the segregation and transfer process, a Gr film composed of single-layers and few-layers of carbon atoms can be formed by doping a growth substrate with carbon via CVD. The Gr film grows by surface segregation of carbon during cooling of the growth substrate. A protective support layer is then coated on the Gr film to provide support for the Gr film and to maintain its integrity when the Gr film is removed from the growth substrate. The surface of the growth substrate is then etched to release the Gr film and protective support layer from the growth substrate. After being released from the growth substrate, the Gr film and protective support layer can be applied onto a target surface, such as top surfaces and side surfaces of merged sub-region 113 of EPIs 105. The protective support layer can then be removed from the Gr film after the Gr film is applied to the target surface.

For example, a metal (e.g., Ni, or Co) coating can be deposited on a silica surface of a substrate, e.g., via electrochemical deposition, electron-beam evaporation or sputtering. A Gr film is then grown via atmospheric CVD (e.g., processing pressure slightly higher than atmospheric, e.g., greater than about 101.325 kPa) on the metal-coated substrate using methane (CH4) as a source for carbon at a high process temperature (e.g., greater than about 400° C.). The Gr film is then coated with polymethylmethacrylate (PMMA) or polymethyl siloxane (PDMS) serving as the protective support layer. The Gr film and PMMA/PDMS are then released by etching the metal coating by an aqueous hydrochloric acid solution or a ferric chloride (FeCl3) solution. After release, the Gr film and PMMA/PDMS are applied to a target surface, such as the top surfaces and side surfaces of merged sub-region 113 of EPIs 105. The PMMA/PDMS can then be removed by an exfoliation operation to transfer the Gr film to the target surface.

In some embodiments, a catalyst-assisted growth process can include three stages: dissociation of the carbon precursor at high temperature (e.g., greater than about 450° C.) onto a polycrystalline metallic catalyst; carbon dissolution into the catalyst sub-surface; and graphene precipitation at the surface of the catalyst as the sample cools down. For example, a catalyst layer, including Ni, Co, W, and Ru, can be formed by any suitable CVD or ALD to cover the target surface. A Gr film can be dissolved into the catalyst layer by performing an inductively coupled plasma chemical vapor deposition (ICP CVD) process at a process pressure in a range from about about $1\times10^{-6}$ Torr to about $6\times10^{-6}$ Torr and at a process temperature in a range from about 400° C. to about 450° C. Acetylene ($C_2H_2$) can be flown at a rate in a range from about 0.05 sccm to about 0.2 sccm as a carbon source. An activation anneal at an annealing temperature in a range from about 380° C. to about 450° C. (e.g., about 400° C.) can drive precipitation and growth of carbon atoms. After cooling down, the catalyst layer can be removed by wet etching or dry etching to expose the Gr film.

In operation 1380 of method 1300, a metal plug can be formed on the second Gr film to fill the contact opening. For example, FIG. 12 is a cross-sectional view of partially fabricated FET structure 1200 along line A-A' after the exemplary formation of metal plug 940. In some embodiments, metal plug 940 can be used as a S/D contact of FET structure 1200.

In some embodiments, metal plug 940 can include any suitable metal material, such as Co, W, and Ru. Metal plug 940 can be formed by any suitable deposition process, such as a CVD process with a process temperature in a range from about 130° C. to about 400° C., a process pressure in a range from about 100 Pa to about 1000 Pa, and a gas flow rate in a range from about 10 sccm to about 500 sccm. A subsequent CMP process can be performed to etch back the deposited metal plug to substantially coplanarize top surfaces of ILD 920, second Gr film 140, and metal plug 940, as shown in FIG. 12.

Since second Gr film 140 is formed to cover the bottom surface and sidewalls of contact opening 930 in previous operation 1370, second Gr film 140 can wrap the bottom surface and sidewalls of metal plug 940, as shown in FIG. 12. Second Gr film 140 can act as a high conductivity liner of metal plug 940 to reduce surface elastic scattering to parasitic resistance, and can also act as a diffusion barrier to suppress metal diffusion from the S/D contact (e.g., metal plug 940) to surrounding dielectric to reduce surface elastic scattering. Further, the thickness of second Gr film 140 is less than the thickness of other Ta/TaN liners and/or barriers used in other devices, thus allowing more volume for the S/D contact and increasing contact area to further reduce the contact resistivity.

Any other suitable operations can be performed after method 1300 to further fabricate FET structure 1200. For example, one or more metal vias in middle-end-of-line (MEOL) and/or in back-end-of-line (BEOL) can be formed above metal plug 940 to form a conductive interconnection. Similar to operation 1370, a Gr film can be formed to wrap each of the one or more metal vias before the metal layer BEOL fill process to reduce the contact resistivity of each metal via.

Accordingly, the present disclosure describes exemplary S/D EPI structures and S/D contacts wrapped with graphene (Gr) layers in fin structures of FETs. The present disclosure also provides exemplary methods for wrapping Gr layers to S/D EPI structures and S/D contacts to achieve lower SBH by SBH tuning and lower contact resistivity by increasing contact area. Specifically, a first Gr film can be formed to wrap S/D EPI structures to reduce S/D contact resistivity by SBH tuning. A second Gr film formed to wrap S/D contacts can act as a high conductivity liner to reduce parasitic resistance and act as a diffusion barrier to reduce surface elastic scattering by metal encapsulation. The first and second Gr films have a reduced thickness which allow increased volumes of the formed S/D EPI structures and S/D contacts, resulting in increased contact areas to further reduce the contact resistivity.

One aspect of the present disclosure provides a semiconductor device including a fin structure on a substrate. The fin structure includes an epitaxial region. The semiconductor device further includes a metal contact above the epitaxial region, and a graphene film covering a top surface and sidewalls of the epitaxial region and covering a bottom surface and sidewalls of the metal contact. In some embodiments, the semiconductor device further includes an etch stop layer on the epitaxial region and an interlayer dielectric layer on the etch stop layer. The metal contact traverses through the etch stop layer and the interlayer dielectric layer and electrically connects to the epitaxial region through the graphene film. In some embodiments, the fin structure is a merged fin structure, and the epitaxial region is a merged epitaxial region.

In some embodiments, the semiconductor device further includes an other fin structure, on the substrate, including an other epitaxial region; a barrier layer on a top surface of the other epitaxial region; an other metal contact above the barrier layer; and a liner layer at an interface between the other metal contact and the barrier layer. In some embodiments, the epitaxial region is an n-type epitaxial region, and the other epitaxial region is a p-type epitaxial region. In some other embodiments, the epitaxial region is a p-type epitaxial region, and the other epitaxial region is an n-type epitaxial region.

In some embodiments, the semiconductor device further includes: an other fin structure, on the substrate, including an other epitaxial region having an opposite type from that of the epitaxial region; an other metal contact above the other epitaxial region; and an other graphene film covering a top surface and sidewalls of the other epitaxial region, and covering a bottom surface and sidewalls of the other metal contact. In some embodiments, a thickness of the graphene film is between about 0.5 nm and about 5 nm.

Another aspect of the present disclosure provides a method of forming a semiconductor device. The method includes: forming a fin structure with an epitaxial layer on a substrate; forming a first graphene film covering a top surface and sidewalls of the epitaxial region; forming a metal contact above the epitaxial region; and forming a second graphene film covering a bottom surface and sidewalls of the metal contact. In some embodiments, the method further includes: forming an etch stop layer on the epitaxial region; forming an interlayer dielectric layer on the etch stop layer; and forming a contact opening that traverses through the etch stop layer and the interlayer and exposes a top surface of the first graphene film. In some embodiments, forming the second graphene film includes forming the second graphene film covering a bottom surface and sidewalls of the contact opening. In some embodiments, forming the first graphene film and the second graphene film includes forming the first graphene film or the second graphene film by a segregation and transfer process or by a catalyst-assisted growth process. In some embodiments, forming the fin structure with an epitaxial layer includes: forming a merged fin structure; and forming a merged epitaxial region.

In some embodiments, the method further includes: forming an other fin structure, on the substrate, including an other epitaxial region having an opposite type from that of the epitaxial region; forming a barrier layer on a top surface of the other epitaxial region; forming an other metal contact above the barrier layer; and forming a liner layer at an interface between the other metal contact and the barrier layer. In some embodiments, the method further includes: forming an other fin structure, on the substrate, including an other epitaxial region having an opposite type from that of the epitaxial region; and forming a third graphene film covering a top surface and sidewalls of the other epitaxial region. In some embodiments, the method further includes: forming an other metal contact above the other epitaxial region; and forming a fourth graphene film covering a bottom surface and sidewalls of the other metal contact.

Another aspect of the present disclosure provides a method of forming a semiconductor device. The method includes: forming a fin structure with a merged epitaxial layer on a substrate; forming a metal contact above the epitaxial layer; and forming a graphene film covering sidewalls of the merged epitaxial region and the metal contact, and in between with the merged epitaxial layer and the metal contact. In some embodiments, forming the graphene film includes forming the graphene film by a segregation and transfer process or by a catalyst-assisted growth process.

In some embodiments, the method further includes: forming an other fin structure, on the substrate, including an other merged epitaxial region having an opposite type from that of the merged epitaxial region; forming a barrier layer on a top surface of the other merged epitaxial region; forming an other metal contact above the barrier layer; and forming a liner layer at an interface between the other metal contact and the barrier layer.

In some embodiments, the method further includes: forming an other fin structure, on the substrate, including an other merged epitaxial region having an opposite type from that of the merged epitaxial region; forming an other metal contact above the other merged epitaxial region; and forming an other graphene film covering a top surface and sidewalls of the other merged epitaxial region, and in between with the other merged epitaxial layer and the other metal contact.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the subjoined claims.

What is claimed is:

1. A method of forming a semiconductor device, comprising:
   forming a fin structure with an epitaxial region on a substrate;
   forming a first graphene film covering a top surface and sidewalls of the epitaxial region;
   forming a metal contact above the epitaxial region; and
   forming a second graphene film in contact with the first graphene film and covering a bottom surface and sidewalls of the metal contact.

2. The method of claim 1, further comprising:
   forming an etch stop layer on the epitaxial region;
   forming an interlayer dielectric layer on the etch stop layer; and
   forming a contact opening that traverses through the etch stop layer and the interlayer dielectric layer and exposes a top surface of the first graphene film.

3. The method of claim 2, wherein forming the second graphene film comprises:
   forming the second graphene film covering a bottom surface and sidewalls of the contact opening.

4. The method of claim 1, wherein forming the first graphene film and the second graphene film comprises:
   forming the first graphene film or the second graphene film by a segregation and transfer process or by a catalyst-assisted growth process.

5. The method of claim 1, wherein forming the fin structure with the epitaxial region comprises:
   forming a merged fin structure; and
   forming a merged epitaxial region.

6. The method of claim 1, further comprising:
   forming an other fin structure, on the substrate, comprising an other epitaxial region having an opposite type from that of the epitaxial region; and
   forming a third graphene film covering a top surface and sidewalls of the other epitaxial region.

7. The method of claim 6, further comprising:
   forming an other metal contact above the other epitaxial region; and
   forming a fourth graphene film covering a bottom surface and sidewalls of the other metal contact.

8. A method of forming a semiconductor device, comprising:
   forming a fin structure with a merged epitaxial region on a substrate;
   forming a metal contact above the merged epitaxial region; and
   forming a graphene film covering sidewalls of the merged epitaxial region and the metal contact, and in between the merged epitaxial region and the metal contact.

9. The method of claim 8, wherein forming the graphene film comprises:
   forming the graphene film by a gas phase synthesis process by using 1,2,3,4-tetraphenylnaphthalene (TPN), Pyrene, or Benzene as a carbon source.

10. The method of claim 8, further comprising:
    forming an other fin structure, on the substrate, comprising an other merged epitaxial region having an opposite type from that of the merged epitaxial region;
    forming an other metal contact above the other merged epitaxial region; and
    forming an other graphene film covering a top surface and sidewalls of the other merged epitaxial region, and in between the other merged epitaxial region and the other metal contact.

11. The method of claim 8, wherein:
    forming the fin structure comprises forming the merged epitaxial region between first and second fin portions of the fin structure; and forming the graphene film comprises forming the graphene film under the merged epitaxial region and between the first and second fin portions.

12. The method of claim 8, wherein forming the graphene film comprises:
   forming a first portion of the graphene film on a slanted side surface of the merged epitaxial region and with a first thickness; and
   forming a second portion of the graphene film on a vertical side surface of the merged epitaxial region and with a second thickness greater than the first thickness.

13. The method of claim 8, wherein forming the graphene film comprises forming the graphene film on a curved upper surface of the merged epitaxial region.

14. A method, comprising:
   forming a fin structure on a substrate;
   forming a source/drain (S/D) structure on the fin structure;
   forming a first graphene film over the S/D structure;
   depositing a dielectric layer on the S/D structure;
   etching the dielectric layer to form an opening that exposes the first graphene film; and
   forming an S/D contact in the opening.

15. The method of claim 14, wherein forming the first graphene film comprises:
   performing a surface treatment on the S/D structure to form an epitaxial termination interface; and
   forming a graphene seeding layer over the epitaxial termination interface.

16. The method of claim 14, wherein forming the first graphene film comprises forming a conformal graphene seeding layer over the S/D structure by performing a gas phase synthesis process.

17. The method of claim 16, wherein forming the first graphene film further comprises applying an ultraviolet cure, a laser treatment, or a thermal anneal on the conformal graphene seeding layer.

18. The method of claim 14, wherein forming the first graphene film comprises tuning a Schottky barrier height of the S/D contact to reduce a resistivity of a contact between the S/D structure and the S/D contact.

19. The method of claim 14, wherein forming the S/D contact comprises:
   forming a second graphene film on side surfaces of the opening; and
   forming a metal plug on the second graphene film.

20. The method of claim 19, wherein forming the second graphene film comprises:
   growing the second graphene film on a growth substrate; and
   transferring the second graphene film to top and side surfaces of the S/D structure.

* * * * *